(12) United States Patent
Xu et al.

(10) Patent No.: US 9,488,908 B2
(45) Date of Patent: Nov. 8, 2016

(54) RAPID FABRICATION OF HIERARCHICALLY STRUCTURED SUPRAMOLECULAR NANOCOMPOSITE THIN FILMS IN ONE MINUTE

(71) Applicants: Ting Xu, Berkeley, CA (US); Joseph Kao, Berkeley, CA (US)

(72) Inventors: Ting Xu, Berkeley, CA (US); Joseph Kao, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/725,617

(22) Filed: May 29, 2015

(65) Prior Publication Data

US 2015/0353693 A1 Dec. 10, 2015

Related U.S. Application Data

(60) Provisional application No. 62/004,732, filed on May 29, 2014.

(51) Int. Cl.
| | | |
|---|---|---|
| *C08F 271/02* | (2006.01) | |
| *B82Y 40/00* | (2011.01) | |
| *B82Y 25/00* | (2011.01) | |
| *B82Y 30/00* | (2011.01) | |
| *G03F 7/00* | (2006.01) | |
| *C09D 153/00* | (2006.01) | |

(52) U.S. Cl.
CPC ........... *G03F 7/0002* (2013.01); *C09D 153/00* (2013.01)

(58) Field of Classification Search
CPC ..... C08F 271/02; B82Y 40/00; B82Y 25/00; B82Y 30/00
USPC ................... 524/508; 427/130, 774; 525/279
See application file for complete search history.

(56) References Cited

U.S. PATENT DOCUMENTS

2012/0104325 A1* 5/2012 Talapin et al. ................ 252/502
2012/0309904 A1* 12/2012 Xu et al. ....................... 525/279

* cited by examiner

*Primary Examiner* — James J Seidleck
*Assistant Examiner* — Deve E Valdez
(74) *Attorney, Agent, or Firm* — Lawrence Berkeley National Laboratory

(57) ABSTRACT

Functional nanocomposites containing nanoparticles of different chemical compositions may exhibit new properties to meet demands for advanced technology. It is imperative to simultaneously achieve hierarchical structural control and to develop rapid, scalable fabrication to minimize degradation of nanoparticle properties and for compatibility with nanomanufacturing. The assembly kinetics of supramolecular nanocomposite in thin films is governed by the energetic cost arising from defects, the chain mobility, and the activation energy for inter-domain diffusion. By optimizing only one parameter, the solvent fraction in the film, the assembly kinetics can be precisely tailored to produce hierarchically structured thin films of supramolecular nanocomposites in approximately one minute. Moreover, the strong wavelength dependent optical anisotropy in the nanocomposite highlights their potential applications for light manipulation and information transmission. The present invention opens a new avenue in designing manufacture-friendly continuous processing for the fabrication of functional nanocomposite thin films.

11 Claims, 14 Drawing Sheets

RAPID FABRICATION OF HIERARCHICALLY STRUCTURED SUPRAMOLECULAR NANOCOMPOSITE THIN FILMS IN ONE MINUTE

CROSS REFERENCE TO RELATED APPLICATIONS

This application claims priority to U.S. Provisional Patent Application No. 62/004,732, filed May 29, 2014, which is herein incorporated by reference.

STATEMENT OF GOVERNMENTAL SUPPORT

The invention described and claimed herein was made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

BACKGROUND OF THE INVENTION

1. Field of the Invention

The present invention relates to the field of block co-polymers and nano-lithography.

2. Related Art

Developments in colloidal particle synthesis enable one to engineer nanoparticles with controlled size, shape, and chemical composition. Numerous studies have demonstrated the significant impact of nanoparticle-based materials in life sciences, microelectronics, light manipulation, energy harvesting and storage. Co-assemblies of nanoparticles and organic building blocks clearly hold promise for generating nanocomposites using different elements on the periodic table that combine the advantages of both families of building blocks. To fulfill these promises, at least two requirements must be satisfied. One is to control the spatial arrangement of nanoparticles spanning multiple length scales in a reproducible manner, so as to modulate inter-particle coupling and the collective properties of nanocomposites. The other is to understand and manipulate the kinetics of the assembly process to ensure compatibility with existing fabrication infrastructures. To be relevant, the fabrication process must be rapid, completed within a few minutes to minimize degradation of nanoparticle properties due to exposure to the processing environment and for compatibility with nanomanufacturing.

In comparison to many current approaches such as DNA and controlled solvent evaporation, block copolymers (BCPs) provide scalable platforms to obtain nanoscopic organization of nanoparticles, but require favorable nanoparticle-polymer interactions to achieve nanoparticle dispersion, and it remains difficult to control inter-particle ordering within BCP microdomains. Additionally, their self-assembly processes typically require tens of minutes or hours to complete and can lead to degradation of inherent optoelectronic properties of the nanoparticles. Thermal annealing alone or in conjunction with solvent annealing has been used to accelerate the assembly process, but is not suitable for temperature sensitive nanoparticles.

BCP-based supramolecules are constructed by non-covalently attaching small molecules to polymer side chains. The presence of small molecules eliminates the need to modify either the nanoparticle ligand or polymer for nanoparticle incorporation and improve inter-particle ordering within BCP microdomains. 1-, 2- and 3-D nanoparticle arrays can be obtained in thin films of supramolecular nanocomposites via solvent annealing for a range of nanoparticles or nanoparticle mixtures. Kinetically, the presence of small molecules also provides unique opportunities to manipulate the energy landscape of the assembly process and to accelerate the assembly kinetics so that inherent properties of nanoparticles can be maintained and continuous thin film processing techniques can be implemented for device fabrication. However, the supramolecular nanocomposite has at least 5 components during solvent annealing, making it extremely challenging to manipulate the assembly process.

BRIEF DESCRIPTION OF THE DRAWINGS

The foregoing aspects and others will be readily appreciated by the skilled artisan from the following description of illustrative embodiments when read in conjunction with the accompanying drawings.

FIG. 4(a) Film thickness vs. time profiles of the ~220 nm nanocomposite thin films annealed under different solvent treatments during in situ GISAXS measurements. FIGS. 4(b), 4(c), and 4(d), respectively. FIG. 4(e) is the plot of the grain size as a function of $f_s$, showing that the ordered nanostructure is optimized at $f_s$=0.31.

FIG. 5(a) The grain size of the nanostructure was plotted against the required annealing time to reach certain $f_s$. FIG. 5(b) The GISAXS patterns of three identical thin films treated with different swelling rates. Hierarchically structured nanoparticle assemblies can be readily obtained in 1 minute. FIG. 5(c) AFM phase image of a ~50 nm nanocomposite thin film in lithographically-patterned trenches that forms unidirectional nanoparticle arrays over macroscopic distances in 1.5 minutes.

FIG. 6(a) Schematics of the ellipsometry measurements of the in-plane ($n_o$-i$k_o$) and out-of-plane ($n_e$+i$k_e$) components of the complex refractive indices. FIG. 6(b) Real refractive index, $n_o$ of different films as a function of wavelength. Wavelength dependent optical birefringence of the film ($\Delta n$~−0.087 at 544 nm) for light manipulation applications as shown in FIG. 6(c) and a wavelength dependence of the reflectivity ratio and the phase difference shown in FIG. 6(d) and FIG. 6(e), respectively.

FIG. 8(a) AFM image, FIG. 8(b) cross-sectional TEM image, FIG. 8(c) GISAXS pattern taken at $\alpha$=0.26°, and (d) $q_y$ linecut at $q_z$, =0.033 Å$^{-1}$ of a ~220 nm PS(19 kDa)-b-P4VP(5.6 kDa)(PDP)$_{1.7}$ thin films containing 6 vol % of ~5 nm Au nanoparticles. The GISAXS pattern indicates that the as-cast supramolecular nanocomposite thin film has nanostructure with overal perpendicular orientation and poor lateral ordering.

FIG. 10(a) The absorption peak of the Au nanoparticles is around 525 nm, which is similar to that of the as-cast/annealed supramolecular nanocomposite thin films as shown in FIG. 10(b). This indicates that the unique optical properties of the annealed film shown in FIG. 6 originate from the collective macroscopic response of the hierarchically structure nanoparticle assembly instead of the plasmonic coupling between individual Au nanoparticles.

DETAILED DESCRIPTION

In the discussions that follow, various process steps may or may not be described using certain types of manufacturing equipment, along with certain process parameters. It is to be appreciated that other types of equipment can be used, with different process parameters employed, and that some of the steps may be performed in other manufacturing equipment without departing from the scope of this invention. Furthermore, different process parameters or manufacturing equipment could be substituted for those described herein without departing from the scope of the invention.

In one embodiment, we systematically analyze the thermodynamics and kinetics of self-assembly in thin films of supramolecular nanocomposite upon exposure to solvent vapor. The assembly kinetics depends on the energetic penalty of the excess interfacial area due to defects, the chain mobility, and the activation energy for inter-domain diffusion. It is the solvent content in the film, $f_s$, during solvent annealing, rather than the swelling rate, which governs the ordering kinetics and pathway. By optimizing only one parameter, i.e. $f_s$, a marked acceleration in the assembly process can be achieved to generate hierarchically structured nanocomposite films in one minute. The timescale of ordering process demonstrated here, i.e. one minute, is clearly compatible with many scalable manufacturing processes, such as draw coating, ink-jet printing, and roll-to-roll fabrication of functional thin films. Furthermore, upon formation of 3-D ordered arrays of gold nanoparticles, nanocomposite thin films exhibit a wavelength dependent optical anisotropy and a rapid switch of polarization states in the visible light regime, confirming the feasibility to generate new functional materials by forming hierarchically structured nanocomposites.

Figure 1:
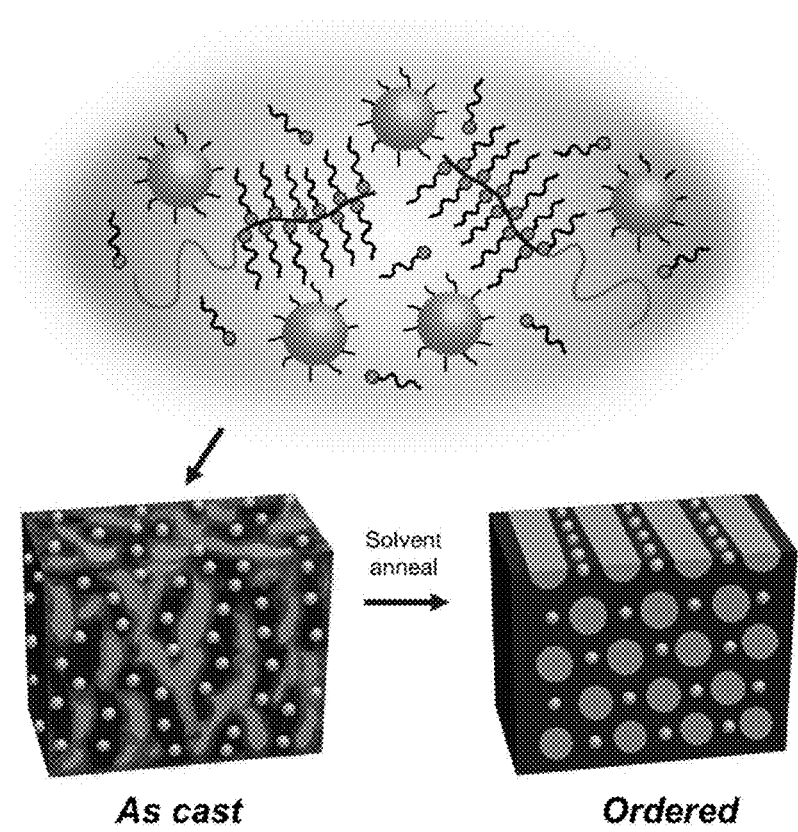
FIG. 1 illustrates Supramolecular nanocomposite thin films.

FIG. 1 illustrates supramolecular nanocomposite thin films. After solvent annealing, the nanocomposite thin film assumes 3-D nanoparticle arrays packed in a distorted hexagonal lattice parallel to the surface.

Results

Fabrication of supramoelcular nanocomposite thin films. The supramolecular nanocomposite is a blend of ~5 nm Au nanoparticles capped with 1-dodecanethiol (See FIG. 1 and FIG. 7) and the supramolecule, PS(19 kDa)-b-P4VP(5.6 kDa)(PDP)$_{1.7}$, prepared by hydrogen-bonding 3-pentadecylphenol (PDP) to the 4VP units of a BCP, polystyrene-b-poly-4-vinylpyridine (PS-b-P4VP) at a PDP:4VP ratio of 1.7. In thin film after solvent annealing using chloroform, it forms hexagonally-packed 3-D nanoparticle arrays where the Au nanoparticles are selectively located at the interstitial sites in the P4VP(PDP) matrix (See FIG. 1).

Figure 2:
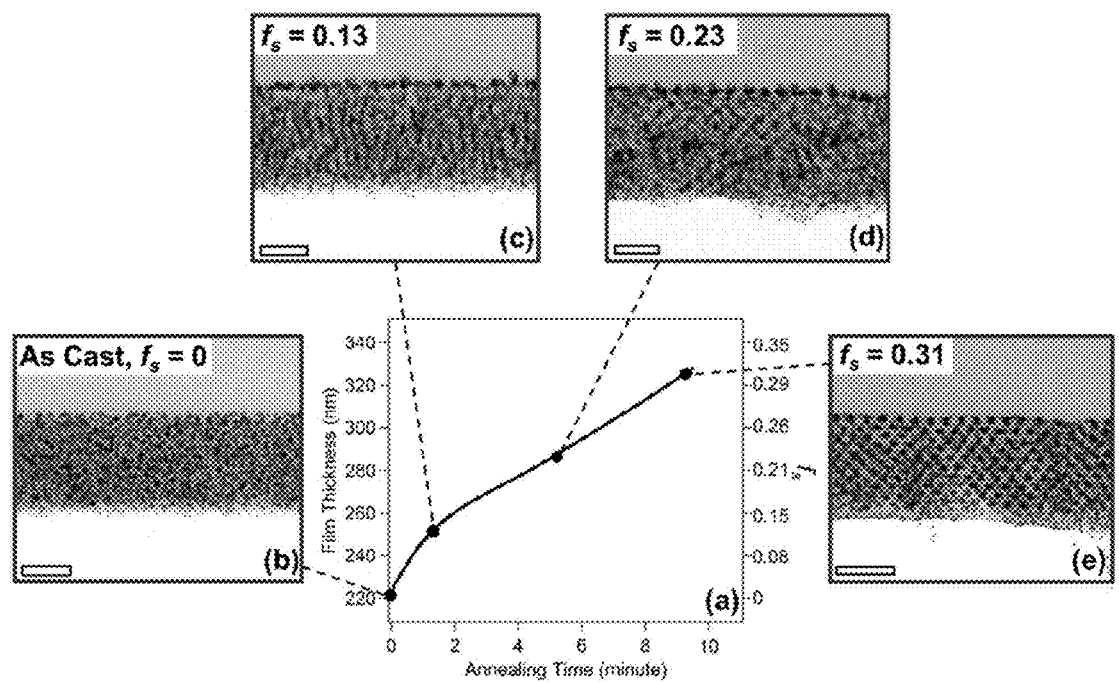
FIG. 2 illustrates the structural evolvement as a function of $f_s$.

FIG. 2 illustrates the structural evolvement as a function of $f_s$. Cross-sectional TEM images of a ~220 nm thin film of a blend of PS(19 kDa)-b-P4VP(5.6 kDa)(PDP)$_{1.7}$ and 6 vol % of ~5 nm Au nanoparticles that was solvent annealed under chloroform vapor at different $f_s$. The film thickness profile during solvent annealing is shown in FIG. 2(a). The film was characterized at $f_s=$(b) 0, (c) 0.13, (d) 0.23, and (e) 0.31, respectively. Scale bar=100 nm.

Assembly kinetics during solvent annealing. The solvent fraction during solvent annealing, $f_s$, is determined by monitoring film thickness in situ (FIG. 2a). FIGS. 2b-e show the cross-sectional TEM images of the films quenched at $f_s=0$, 0.13, 0.23, and 0.31, respectively. The diffusion coefficient of CHCl$_3$ in polymer is ~$10^{-12}$ m$^2$ s$^{-1}$. The solvent molecules are distributed uniformly in the film for the timescale considered here. The as-spun film is microphase-separated with a poorly ordered structure (FIG. 2b). The excess interface resulting from defects results in a sufficient thermodynamic driving force to form ordered nanostructure, provided the components are mobile. Initially, a nanostructure normal to the film surface developed at $f_s=0.13$ (FIG. 2c). This can be attributed to the solvent gradient field normal to the surface during spin casting. Upon further annealing at $f_s=0.23$, the supramolecule locally arranged itself and formed distorted hexagonally packed cylinders oriented parallel to the surface and the nanoparticles ordered within the P4VP(PDP) matrix (FIG. 2d). With time, the grain size of the in-plane hexagonal lattice increased from the film surface, resulting in highly ordered hexagonally packed 3-D nanoparticle arrays parallel to the surface throughout the film (FIG. 2e).

Figure 3:
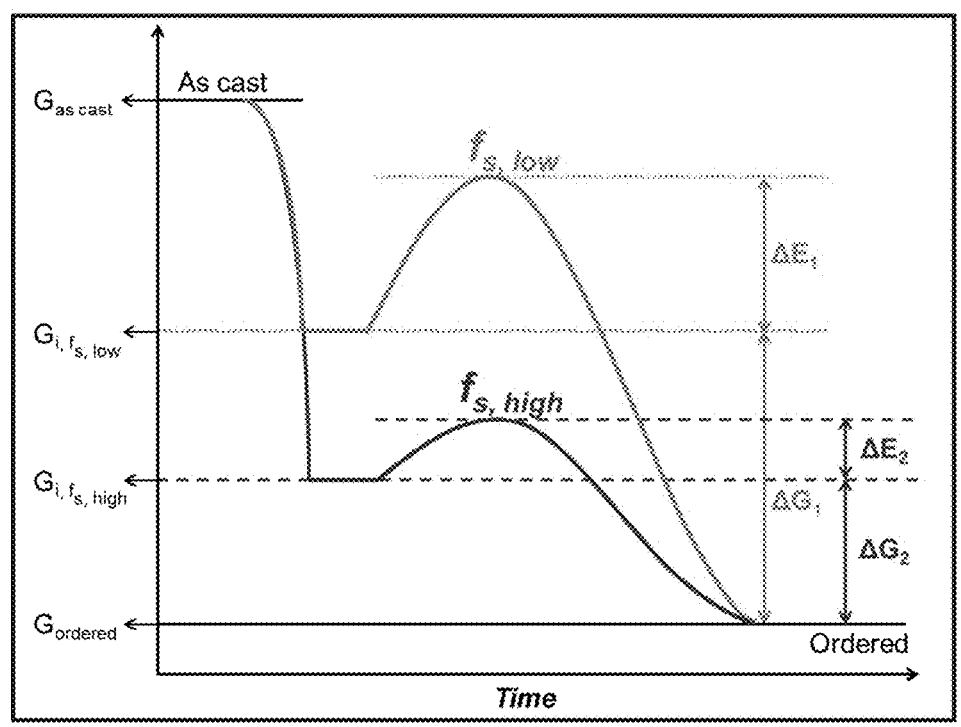
FIG. 3 illustrates the qualitative free energy diagram of the assembly pathway.

FIG. 3 illustrates the qualitative free energy diagram of the assembly pathway. The as-cast film has the largest value of free energy $G_{as\ cast}$ due to the interfacial energy associated with defects. The energy difference between the as-cast and ordered states $\Delta G$ is the thermodynamic driving force of the assembly process. G reduces as a function of $f_s$ since the solvent mediates energy cost of defects. $\Delta E$ corresponds to the activation energy barrier for the supramolecular nanocomposite to order.

The ex situ TEM results nicely capture the self-assembly pathway of supramolecular nanocomposites in thin films and can be described in terms of the thermodynamics and kinetics in a qualitative manner. FIG. 3 shows the energy landscape of the assembly process for two solvent fractions $f_{s,\ low}$ and $f_{s,\ high}$. $G_{as\ cast}$ and $G_{ordered}$ refer to the overall energy of the as-cast film and that of the ordered one. Overall, the main driving force for the structural evolution, i.e., the energy difference, ΔG, between the as-cast and ordered films, is to minimize the interfacial area at the defects. ΔG can be approximated as γ·ΔA, where γ is the interfacial energy between PS and P4VP(PDP)$_{1.7}$/nanoparticles and ΔA is the interfacial area due to the defect.

$$Y = \frac{kT}{a^2}\sqrt{\frac{\chi_{eff}}{6}},$$

and $\chi_{eff} = \chi_o(1-f_s)$, where $\chi_{eff}$ and $\chi_o$ are the Flory-Huggins interaction parameters of the supramolecule with and without solvent, respectively.[34] As $f_s$ increases, the energetic cost of defects and the thermodynamic driving force to form ordered structure decreases, and thus may lead to a lower assembly rate following the Arrhenius equation.

Kinetically, the formation of the nanostructure requires the re-arrangement of material in the nanocomposite. The diffusion rate depends on the chain mobility and the energy barrier, $\Delta E_a$, for the inter-domain diffusion. The presence of solvent lowers the $T_g$ of the supramolecule, which is estimated to be 34.7, 13.4, and 0° C. at $f_s$=0.13, 0.23, and 0.31, respectively. The chain mobility of the supramolecule increases as a function of $f_s$. The diffusion constant of the supramolecular nanocomposite should be similar to that of supramolecule or BCP. At the interface between two blocks, a diffusing chain experiences a uniform potential when diffusing parallel to the interface but a periodic potential for perpendicular diffusion, resulting in an anisotropy in the diffusion coefficients parallel to the interface $D_{para}$ and normal to the interface $D_{perp}$. The interface $D_{perp}$ follows a hindered diffusion mechanism and is expressed as $D_{perp}$ exp($-\Delta E_a$). $\Delta E_a$ is proportional to $\chi_{eff}$ the enthalpic penalty for pulling one block through the other domain. The anisotropic diffusion explains the assembly pathway observed in the cross-sectional TEM images in FIG. 2. At low $f_s$, $D_{para}$ is higher than $D_{perp}$ due to the high $\chi_{eff}$ and the nanocomposite forms cylinders perpendicular to the surface. As $f_s$ increases, $\chi_{eff}$ decreases, so the inter-domain diffusion is less costly, allowing the supramolecule and nanoparticles to rearrange and form a parallel cylindrical morphology.

Figure 4:
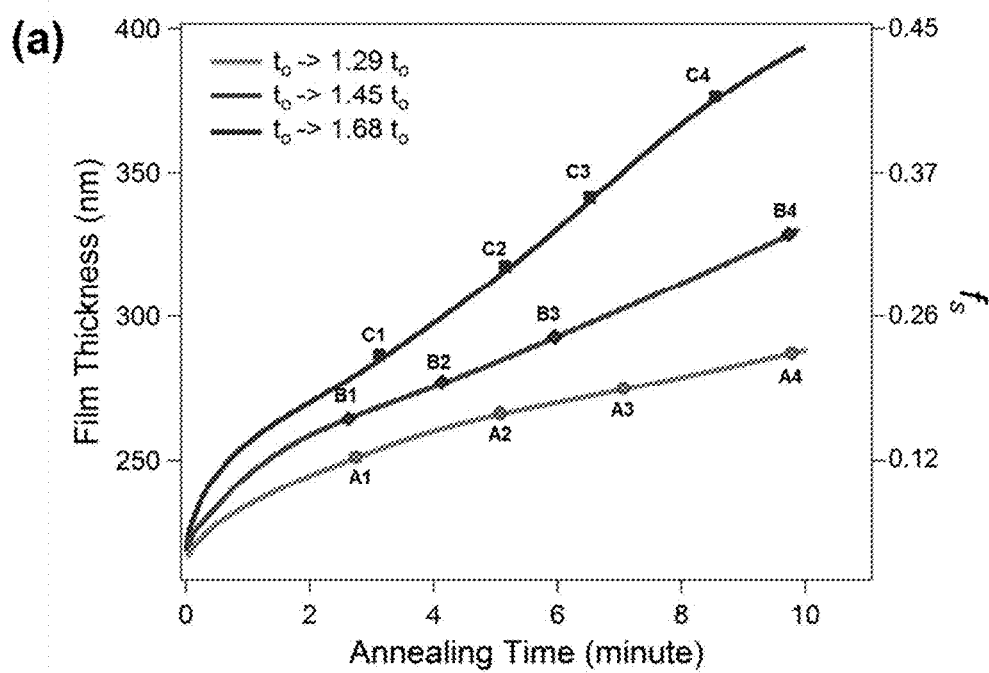
FIG. 4a-4e illustrates the in-situ GISAXS studies on the assembly pathway and kinetics.
Figure 4:
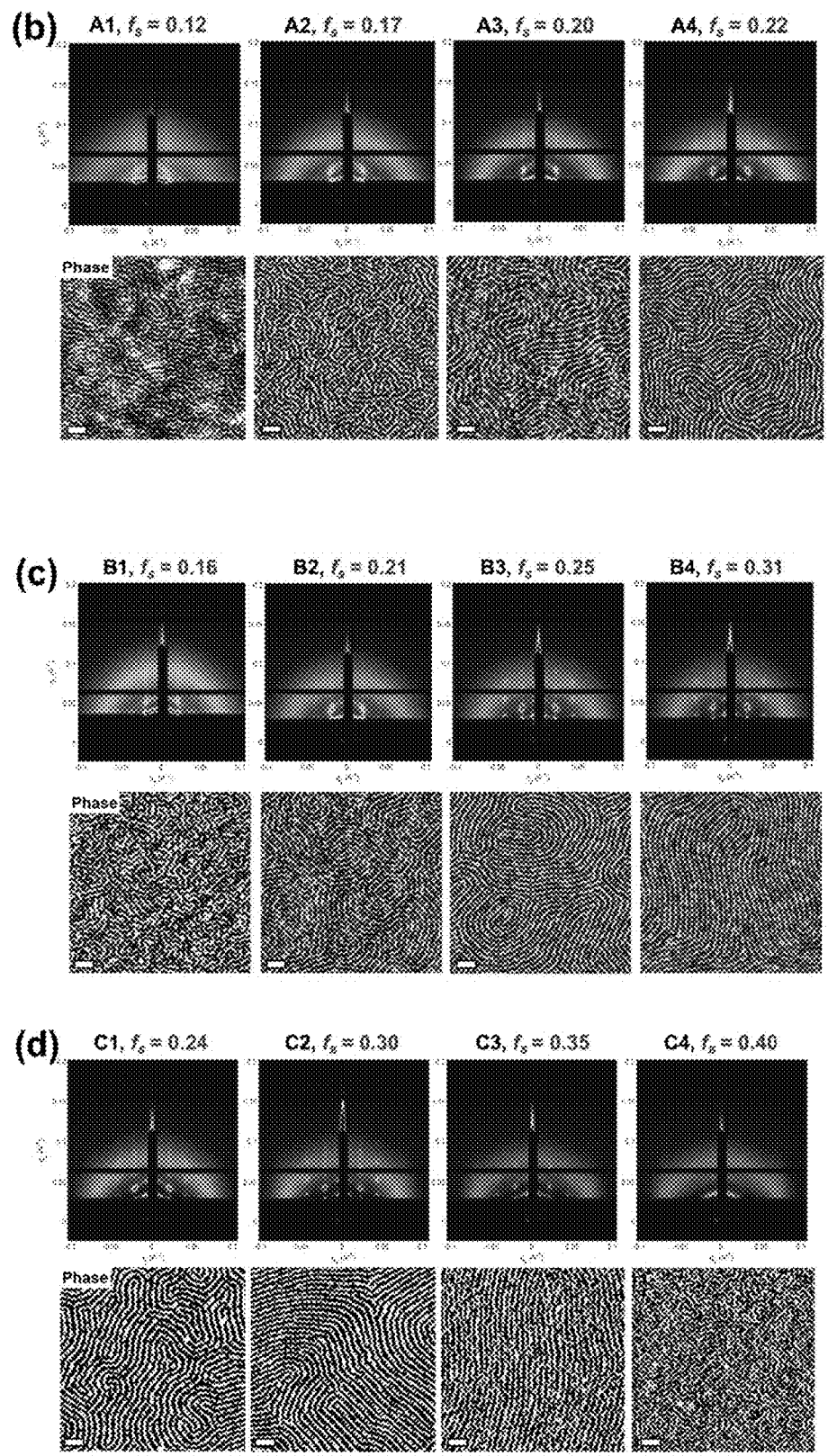
Figure 4:
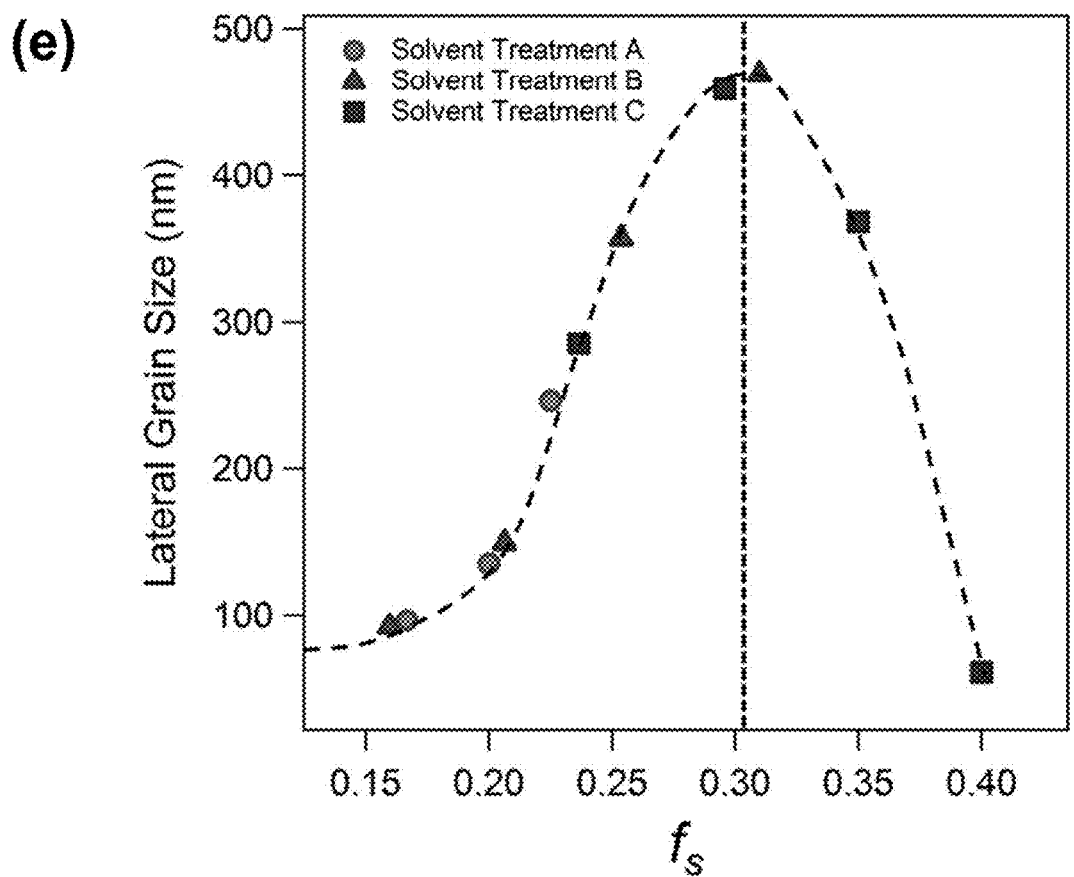

FIG. 4 illustrates the in-situ GISAXS studies on the assembly pathway and kinetics. FIG. 4(a) Film thickness vs. time profiles of the ~220 nm nanocomposite thin films annealed under different solvent treatments during in situ GISAXS measurements. Solvent treatments A, B, and C allowed the three nanocomposite thin films to reach $f_s$=0.23, 0.31, and 0.40 in 10 minutes, respectively. The GISAXS patterns and the corresponding AFM phase images during solvent treatments A, B, and C at the points indicated in FIG. 4(a) are shown in panels FIGS. 4 (b), 4(c), and 4(d), respectively. FIG. 4(e) is the plot of the grain size as a function of $f_s$, showing that the ordered nanostructure is optimized at $f_s$=0.31. The dotted line is intended as a visual guide to further elucidate the trend in the grain size change. Scale bar=100 nm.

In situ X-ray scattering measurements. FIG. 4 shows the in situ grazing incidence small angel X-ray scattering (GISAXS) studies of ~200 nm thin films of PS(19 kDa)-b-P4VP(5.6 kDa)(PDP)$_{1.7}$/5 nm Au nanoparticle blend that underwent three different solvent treatments. The corresponding AFM images of the films are also shown. The ordering in the as-cast film is poor, as evidenced by the broad Bragg peak and the structure has an overall vertical alignment biased by the solvent field during spin casting. Upon exposure to the solvent under solvent treatment A where $f_s$ was increased from 0 to 0.23 in 10 minutes, the GISAXS pattern A1 at $f_s$=0.12 shows a diffraction ring from the nanostructure (FIG. 4b). The corresponding AFM image shows the cylindrical microdomains with different orientations with respect to the interface. When $f_s$ is between 0.13 and 0.23, there are two spots of increasing intensity along the first Bragg rod, indicating that the cylindrical microdomains are beginning to align parallel to the surface. At $f_s$=0.23, the scattering pattern corresponds to hexagonally-packed nanoparticle arrays oriented parallel to the surface. Under solvent treatment B where $f_s$ was increased from 0 to 0.31 in 10 min, the film is allowed to reach a higher $f_s$. In GISAXS pattern B3 at $f_s$=0.25 (FIG. 4c), higher order peaks in the diffraction pattern are seen which shows the completion of the re-orientation of the cylindrical microdomains and the formation of distorted hexagonally packed nanoparticle arrays parallel to the surface. Further annealing ($f_s$=0.31) leads to a larger grain size of the in-plane morphology evidenced by a set of sharper Bragg diffraction peaks in the GISAXS pattern and the improved long-range order seen in the AFM image corresponding to B4. However, when 0.31<$f_s$<0.35 under solvent treatment C, the GISAXS patterns and the corresponding AFM images indicate that the ordered structure deteriorates and becomes disordered at high $f_s$ (FIG. 4d). When $f_s$=0.4, the GISAXS pattern at C4 is dominated by the "correlation hole" effect and no clear structure factor features are observed. The lateral grain size for each nanocomposite thin film was estimated using the Scherrer equation and plotted in FIG. 4e as a function of $f_s$. All results fall on one master curve and the largest grain size, ~0.47 μm, is obtained at $f_s$=0.31.

Figure 5:
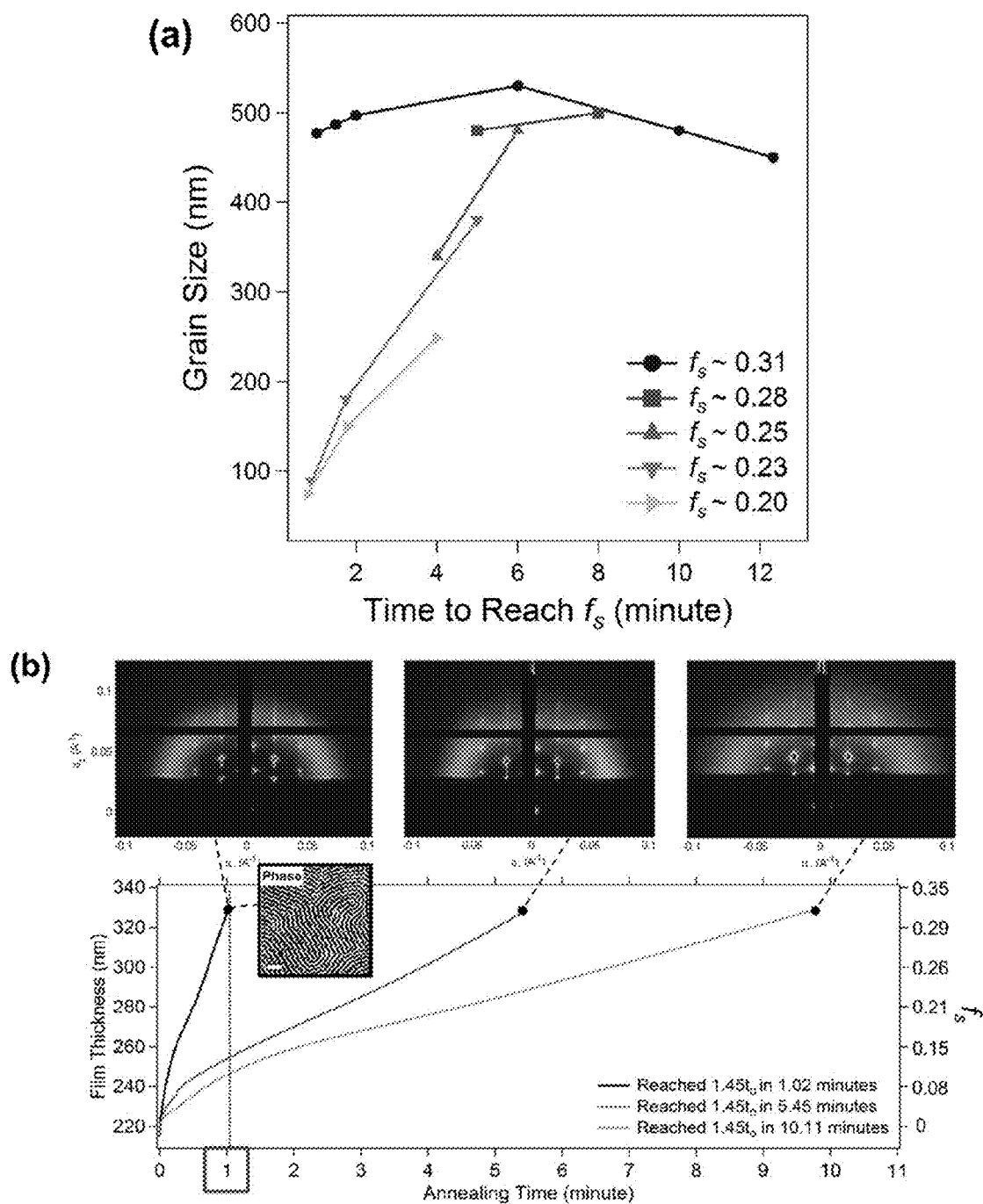
FIG. 5a-5c illustrates a Time-$f_s$ superposition during solvent annealing. A series of in situ GISAXS studies were conducted on six identical nanocomposite thin films.
Figure 5:
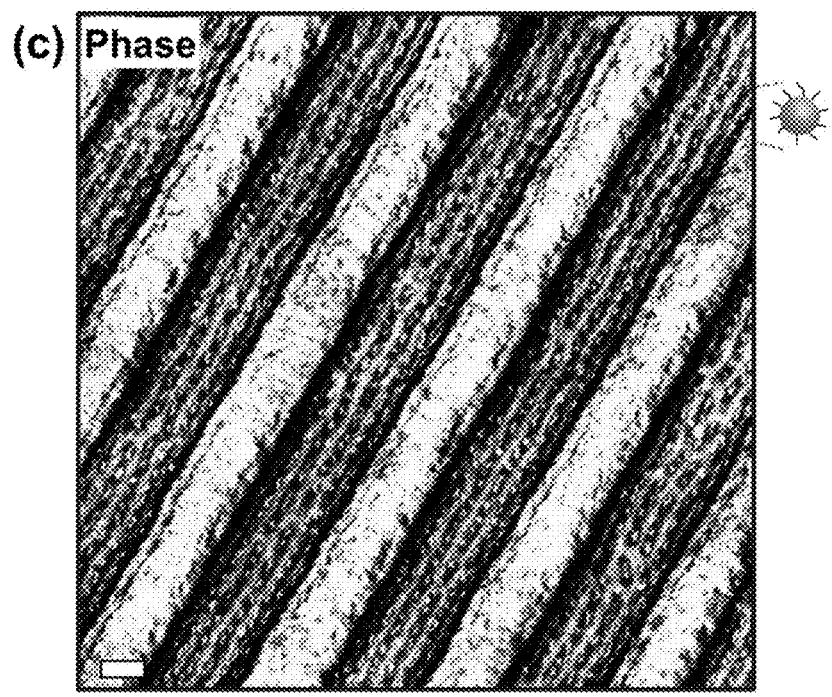

FIG. 5 illustrates a time-$f_s$ superposition during solvent annealing. A series of in situ GISAXS studies were conducted on six identical nanocomposite thin films. (a) The grain size of the nanostructure was plotted against the required annealing time to reach certain $f_s$. (b) The GISAXS patterns of three identical thin films treated with different swelling rates. Hierarchically structured nanoparticle assemblies can be readily obtained in 1 minute. (c) AFM phase image of a ~50 nm nanocomposite thin film in lithographically-patterned trenches that forms unidirectional nanoparticle arrays over macroscopic distances in 1.5 minutes. The bright circular dots in the image represent the 5 nm nanoparticles as illustrated by the schematics. Scale bar=100 nm.

Hierarchically structured nanocomposites in one minute. In addition to $f_s$, the swelling rate is another parameter during the solvent treatments. A series of in situ GISAXS studies were conducted to reach a specific $f_s$ at different swelling rates and the grain size was plotted against annealing time for each $f_s$ (FIG. 5a). The results show a time $f_s$ superposition phenomenon. The system needs longer annealing time to reach an ordered state at relatively low $f_s$ as the assembly rate is facilitated by ΔG but limited by $\Delta E_a$ and chain mobility. Near the optimal $f_s$, the grain growth rate is very fast initially due to the dominant driving force but eventually experiences retardation as a result of the competition between the kinetic terms and ΔG. The results indicate that $f_s$ determines the assembly rate and the solvent entry rate plays a minimal role in the assembly kinetics. Similar grain sizes of the optimized nanostructure were observed in the film that reached the same $f_s$ at three different swelling rates during annealing (FIG. 5b). Ordered films of hierarchically structured supramolecular nanocomposite can be readily obtained in one minute. However, the decreasing ΔG at high $f_s$ limits the growth of the nanostructure over micrometer scales. To optimize nanostructure in a short period of annealing time at high $f_s$, the solvent treatment is applied to the nanocomposite film on lithographically patterned surface (FIG. 5c). The film reached the optimal $f_s$ in 1.5 minutes during solvent annealing, yielding unidirectional nanoparticle arrays in the nanocomposite film over macroscopic distances in the trenches.

Figure 6:
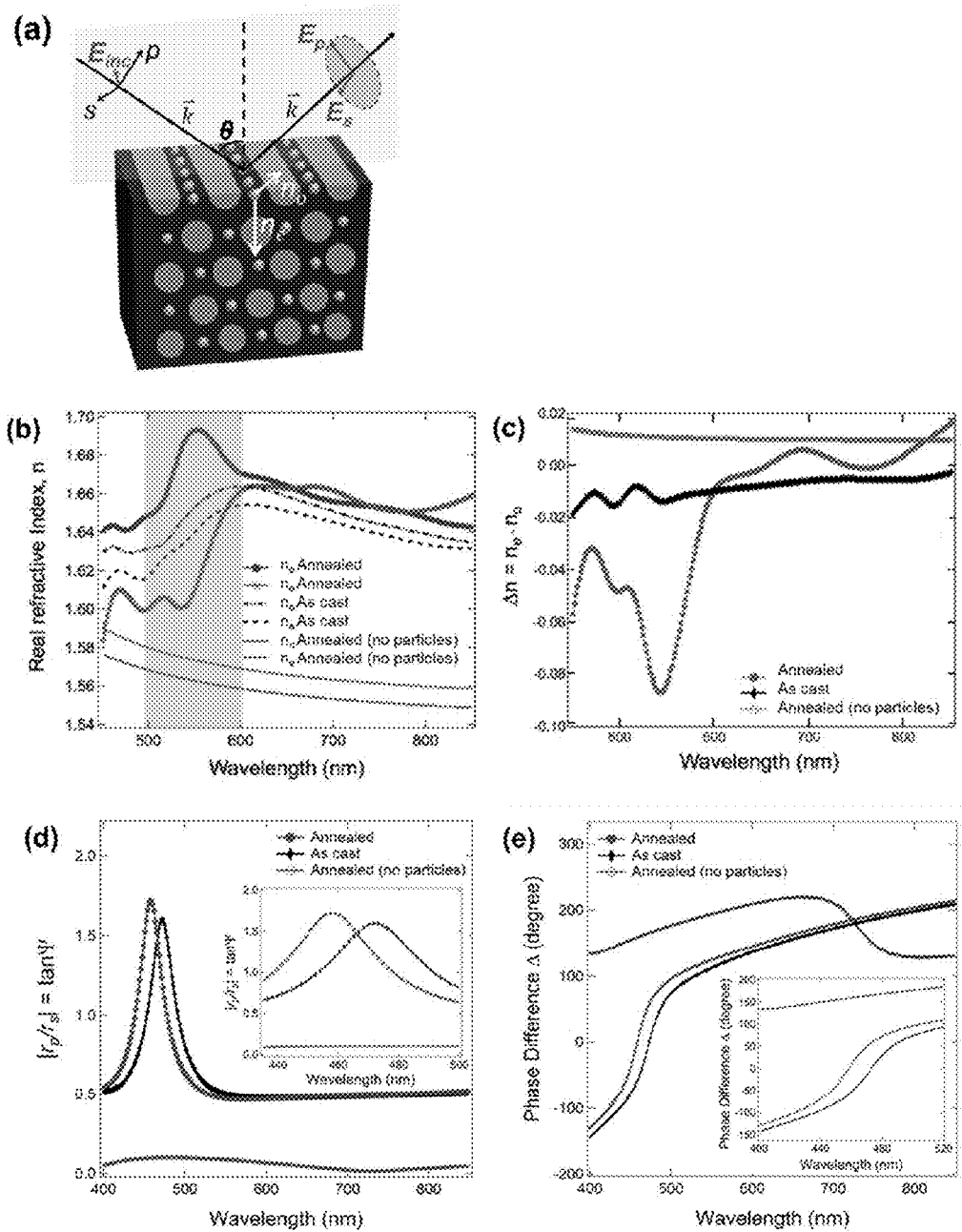
FIG. 6a-6e illustrates a Wavelength dependent optical anisotropy in nanocomposite thin films.

FIG. 6 illustrates the wavelength dependent optical anisotropy in nanocomposite thin films. (a) Schematics of the ellipsometry measurements of the in-plane ($n_o+ik_o$) and out-of-plane ($n_e+ik_e$) components of the complex refractive indices. (b) Real refractive index, n of different films as a function of wavelength. Ordered nanocomposite thin film shows a pronounced peak near λ=544 nm (highlighted in grey) due to the strong interaction between the incident electromagnetic wave and the collective plasmonic coupling of the ordered nanoparticle chains parallel to the surface. This leads to a wavelength dependent optical birefringence of the film (Δn~−0.087 at 544 nm) for light manipulation applications as shown in (c) and a wavelength dependence of the reflectivity ratio and the phase difference shown in (d) and (e), respectively.

Wavelength dependence optical anisotropy. Once the nanocomposite is ordered, the inter-particle distance and coupling are defined, leading to new properties unique to ordered arrays of nanoparticles (FIG. 6). For the solvent annealed nanocomposite thin films, the in-plane inter-particle distance is 9.6 nm, smaller than that of out-of-plane (26 nm), thereby leading to a stronger in-plane inter-particle plasmonic coupling to the first approximation. Indeed, a wavelength-dependent optical anisotropy was observed and the optical birefringence, Δn, is close to −0.05 between 400 to 600 nm (FIG. 6b). In contrast, the as-cast film mainly consists of randomly distributed Au nanoparticles and is fairly optically isotropic (See FIG. 8 and FIG. 9). Different from other materials with optical anisotropy, the refractive indices of the ordered nanocomposite have strong wavelength dependence. The highest Δn is −0.087 at 544 nm, comparable to that of lithium niobate (FIG. 6c). The complex reflectivity ratio ($\rho=r_p/r_s=\tan(\Psi)\cdot e^{i\Delta}$) was measured as a function of wavelength to evaluate the optical properties of nanocomposite thin films, where $r_p$ and $r_s$ are the complex reflection coefficients for p- and s-polarized light and tan(ψ) and Δ are the changes in amplitude and phase between p and s components of polarized light reflected from the film as shown in FIGS. 6d and 6e, respectively. When the incident angle was close to the Brewster angle, θ=55° in this case, the reflection from the film of supramolecule alone is s-polarized over a broad range of wavelength as expected. For nanocomposites, on the contrary, the presence of Au nanoparticles leads to large changes in both tan(ψ) and Δ (FIG. 6c). The wavelength dependent polarization was clearly seen between 400 to 550 nm for the nanocomposite thin films before and after solvent annealing. Notably, there is a strong blue shift from 457 to 472 nm (~15 nm) when Au nanoparticles are rearranged from disordered to ordered arrays.

Thus, the nanocomposite thin films can polarize lights of different wavelength by simply varying the spatial arrangement of nanoparticles. The Au nanoparticle used here is only 5 nm in size and the edge-to-edge distance between two particles is ~3-4 nm. Thus, the plasmonic coupling between the nanoparticles is fairly weak as can be seen in the UV-vis spectra of the nanocomposite thin films (See FIG. 10). However, simply by varying the nanoparticle assemblies in thin films via the solvent treatment demonstrated here, the macroscopic optical properties of the nanocomposites can be tailored along different directions. It is worthwhile to note that the dimensions of the nanoparticle arrays are at least one order of magnitude smaller than that of visible wavelength. However, the nanocomposite still exhibits quite large optical anisotropy, clearly demonstrating the potential of supramolecular nanocomposites as metamaterials. More importantly, the spatial arrangement of nanoparticles after annealing leads to anisotropic collective properties with strong wavelength dependence even though the inter-particle coupling is rather weak. Thus, the nanocomposite films presented here open an opportunity to manipulate how light of different wavelength interacts with the film to tune the functional wavelength range of the optical coating.

Figure 7:
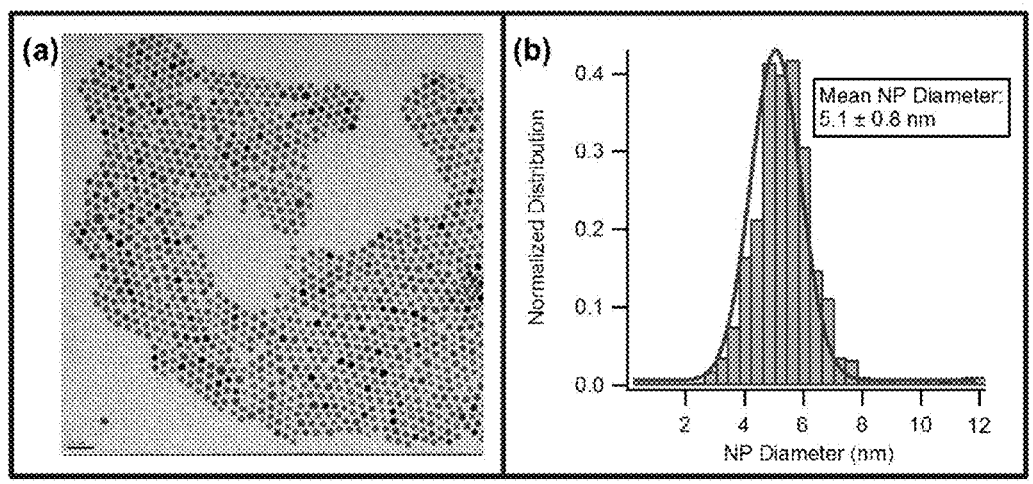
FIG. 7a-7b illustrates a nanoparticle size analysis, FIG. 7(a) TEM image of the synthesized Au nanoparticles capped by 1-dodecanethiol and FIG. 7(b) the size analysis of the nanoparticles.

FIG. 7 illustrates a nanoparticle size analysis, 1(a) TEM image of the synthesized Au nanoparticles capped by 1-dodecanethiol and 1(b) the size analysis of the nanoparticles.

Figure 8:
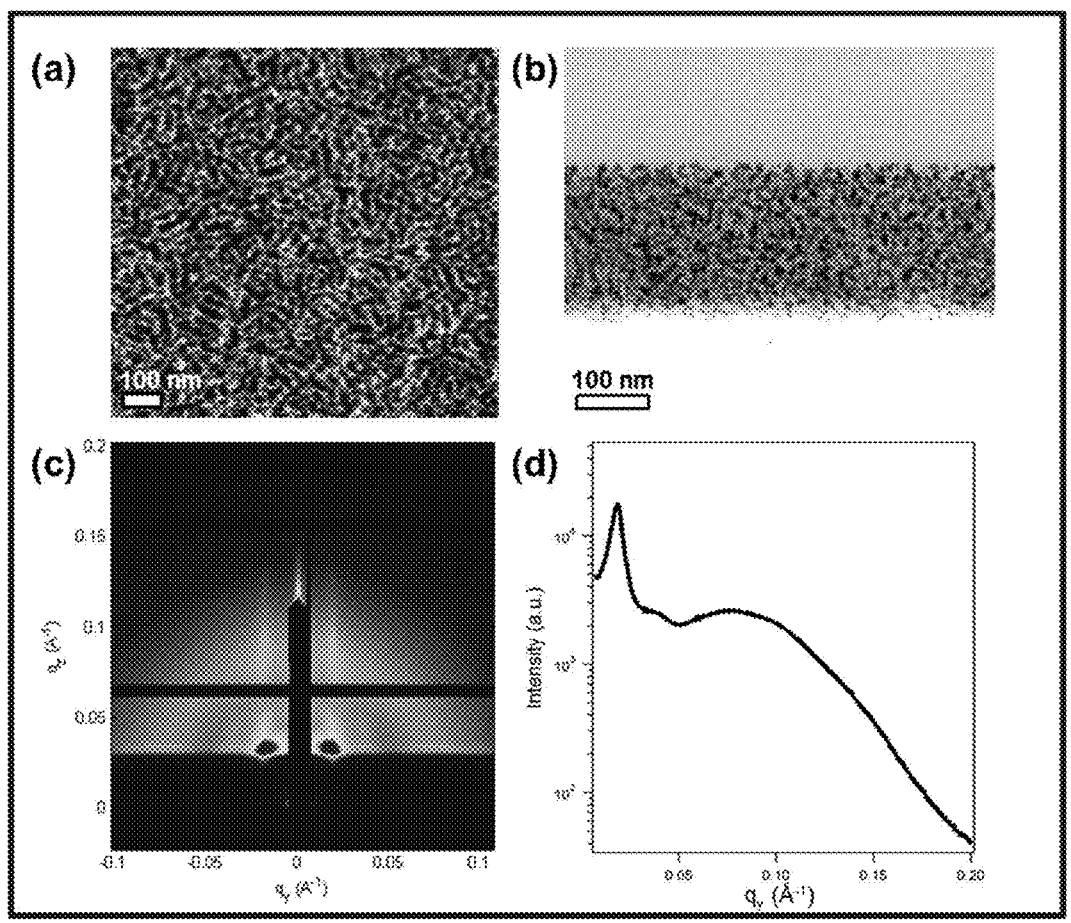
FIG. 8a-8d illustrates a morphology of the as-cast supramolecular nanocomposite.

FIG. 8 illustrates a morphology of the as-cast supramolecular nanocomposite. (a) AFM image, (b) cross-sectional TEM image, (c) GISAXS pattern taken at α=0.26°, and (d) $q_y$ linecut at $q_z$=0.033 Å$^{-1}$ of a ~220 nm PS(19 kDa)-b-P4VP(5.6 kDa)(PDP)$_{1.7}$ thin films containing 6 vol % of ~5 nm Au nanoparticles. The GISAXS pattern indicates that the as-cast supramolecular nanocomposite thin film has nanostructure with overal perpendicular orientation and poor lateral ordering.

Figure 9:
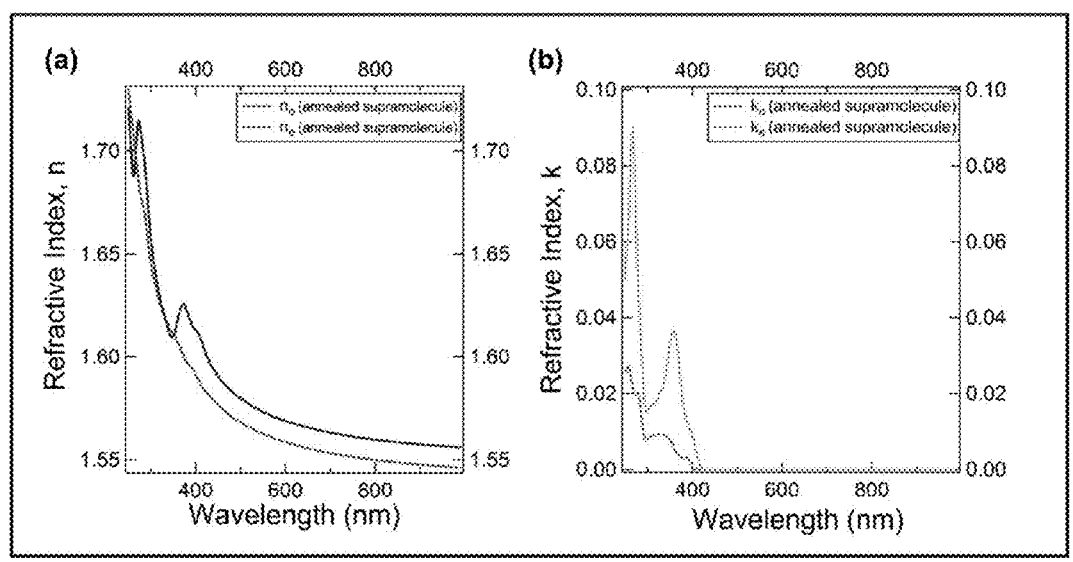
FIG. 9a illustrates the complex refractive indices of the annealed PS(19 kDa)-b-P4VP(5.6 kDa)(PDP)$_{1.7}$ supramolecular thin film. The wavelength dependence of the real part and the imaginary part of the refractive indices are plotted from 250 nm to 1000 nm in FIG. 9(a) and FIG. 9(b), respectively. $n_o+ik_o$ and $n_e+ik_e$ represent the in-plane and out-of-plane components of the complex refractive indices, respectively. Weak wavelength dependence of n and k is observed from 450 to 600 nm, confirming that the optical anisotropy of the annealed nanocomposite thin film shown in FIGS. 6a and 6b arises from the hierarchically ordered Au nanoparticles.

FIG. 9 illustrates the complex refractive indices of the annealed PS(19 kDa)-b-P4VP(5.6 kDa)(PDP)$_{1.7}$ supramolecular thin film. The wavelength dependence of the real part and the imaginary part of the refractive indices are plotted from 250 nm to 1000 nm in (a) and (b), respectively. $n_o+ik_o$ and $n_e+ik_e$ represent the in-plane and out-of-plane components of the complex refractive indices, respectively. Weak wavelength dependence of n and k is observed from 450 to 600 nm, confirming that the optical anisotropy of the annealed nanocomposite thin film shown in FIGS. 6a and 6b arises from the hierarchically ordered Au nanoparticles.

Figure 10:
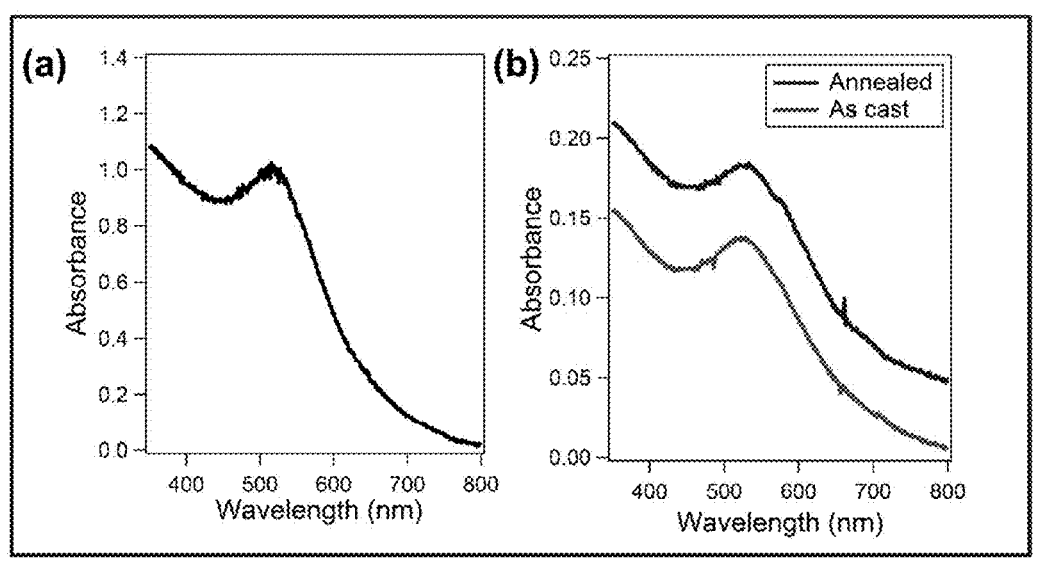
FIG. 10a-10b illustrates the UV-Vis spectra of 5 nm Au nanoparticles in CHCl$_3$ and supramolecular nanocomposite thin films.

FIG. 10 illustrates the UV-Vis spectra of 5 nm Au nanoparticles in CHCl$_3$ and supramolecular nanocomposite thin films. FIG. 10(a) The absorption peak of the Au nanoparticles is around 525 nm, which is similar to that of the as-cast/annealed supramolecular nanocomposite thin films as shown in FIG. (b). This indicates that the unique optical properties of the annealed film shown in FIG. 6 originate from the collective macroscopic response of the hierarchically structure nanoparticle assembly instead of the plasmonic coupling between individual Au nanoparticles.

Figure 11:
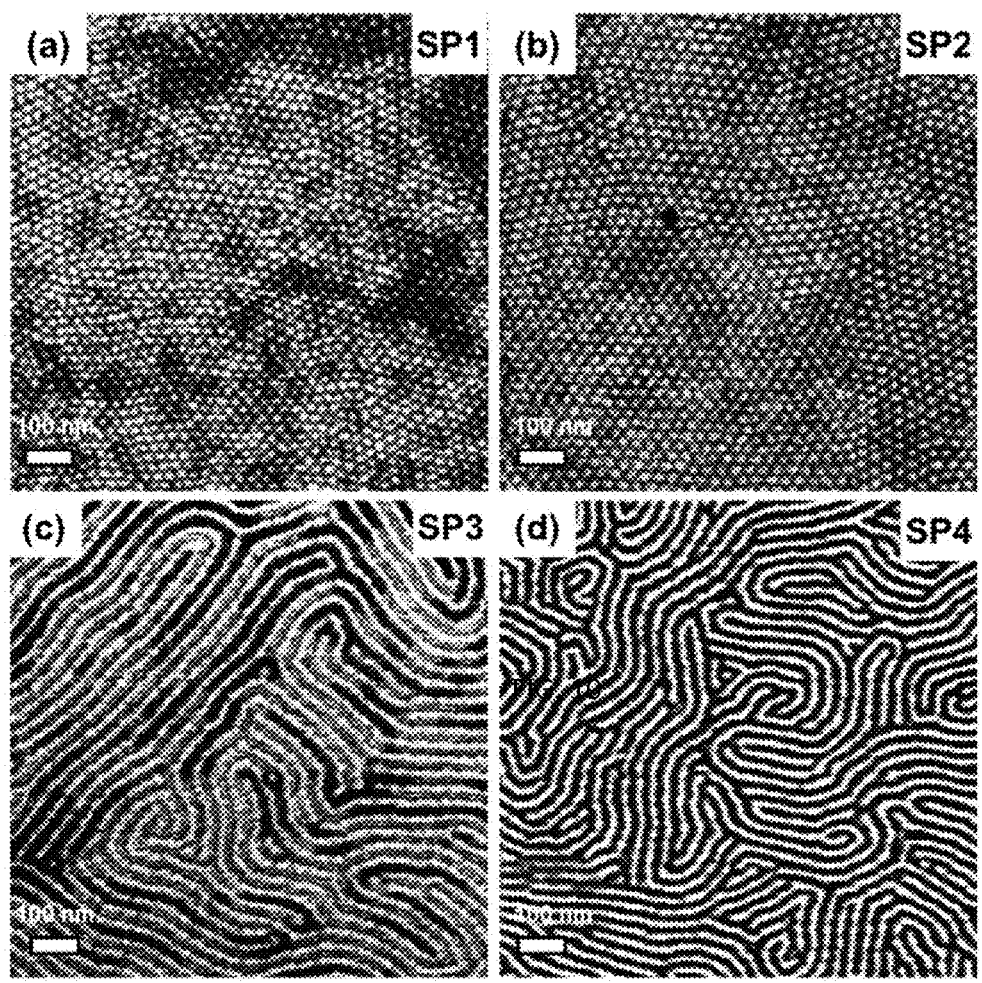
FIG. 11a-11d illustrates the effect of small molecule loading on the kinetic pathway. AFM images of the ~100 nm thin films containing FIG. 11(a) SP1, FIG. 11(b) SP2, FIG. 11(c) SP3, and FIG. 11(d) SP4 supramolecules, respectively. All the films reached $t=1.45\ t_o$ during solvent annealing. SP1 and SP2 remained in non-equilibrium state whereas the supramolecules with more unbound PDP, SP3 and SP4, formed parallel morphology and reached thermodynamic equilibrium state in the film under the same annealing condition.

FIG. 11 illustrates the effect of small molecule loading on the kinetic pathway. AFM images of the ~100 nm thin films containing FIG. 11(a) SP1, FIG. 11(b) SP2, FIG. 11(c) SP3, and FIG. 11(d) SP4 supramolecules, respectively. All the films reached t=1.45 $t_o$ during solvent annealing. SP1 and SP2 remained in non-equilibrium state whereas the supramolecules with more unbound PDP, SP3 and SP4, formed parallel morphology and reached thermodynamic equilibrium state in the film under the same annealing condition.

Discussion

The apparent assembly rate and the pathway in the supramolecular nanocomposite thin film reflect a balance between ΔG, the mobility of the supramolecules, and ΔE$_a$, all of which depend on $f_s$. Modulating $f_s$ during solvent annealing enables control over the assembly kinetics and pathway in the system. At low $f_s$ (e.g., $f_s$<0.12), ΔG is large and so is ΔE$_a$. $D_{perp}$ is lower than $D_{para}$, allowing only short-range diffusion along the interface to improve the perpendicular morphology at intermediate $f_s$ (e.g., 0.12<$f_s$<0.23), the presence of solvent lowers the ΔE$_a$ to make $D_{perp}$ appreciable. As $f_s$ approaches an optimal value, in this case $f_s$=0.31, the nanocomposite orders rapidly. At high $f_s$ (e.g., $f_s$>0.31), ΔG decreases significantly and assemblies with high defect density or in disordered state were observed even though the increased chain diffusion and lowered $\Delta E_a$ should facilitate the defect annihilation.

The processing parameters used for supramolecular nanocomposite thin films may also be applicable to other BCP-based systems. However, to achieve the assembly within the absolute time scale presented here, i.e. one minute, which is required to be compatible with current film processing techniques and on-line continuous fabrication, the following factors are unique to supramolecular systems and need to be taken into consideration to design the nanocomposite. Small molecules were shown to control inter-particle ordering, incorporate functionalities, and modulate the local environment of nanoparticles. Here, the presence of PDP modulates the thermodynamics and kinetics and facilitates the fast assembly process during solvent annealing (See FIG. 11). PDP molecules form hydrogen bonds with P4VP to change the polymer chain architecture from coil to comb and reduce chain entanglement. Unbound PDP molecules act as a plasticizer to modulate chain mobility and their spatial arrangement influences $\chi_{eff}$. In addition, since PDP has a higher solubility in $CHCl_3$ than the supramolecule, it can act as a solvent absorber to make the entire film swell faster than those with a lesser amount of or no unbound PDP. Thus, the supramolecular system gains mobility rapidly.

In summary, these studies show a comprehensive investigation of the assembly kinetics in the nanocomposite thin films during solvent annealing. By understanding the interplay between the energetic driving forces and kinetic pathways, a fast ordering process with a minimal amount of solvent can be designed to achieve hierarchically structured nanocomposite thin films over macroscopic distances. The mechanism shown provides fundamental guidance for designing manufacturing-friendly processing techniques to enable scalable nanofabrication of nanocomposite-based devices using blade coating, ink-jet printing, and dynamic zone annealing. Furthermore, the wavelength dependent anisotropic optical properties for 3-D ordered arrays of gold nanoparticles clearly demonstrated the potential and feasibility for engineering nanocomposites for light manipulation and require further in-depth investigation. The optical properties of nanocompo site thin films depend on the properties of individual nanoparticles and, equally importantly, well defined inter-particle distance along different directions. Since the supramolecular approach is compatible with nanoparticles of different chemical compositions and can lead to a library of nanoparticle assemblies, present studies clearly open a viable approach to generate a new family of optical coating for light manipulation, wave plates, optical modulators and, potentially, information transmission.

Methods

Preparation of supramolecular nanocomposite thin films. PS(19 kDa)-b-P4VP-(5.2 kDa) (PDI=1.09) was purchased from Polymer Source, Inc. 3-n-Pentadecylphenol (95%) was purchased from Acros. Chloroform was purchased from Fisher. All chemicals were used as received. The Au nanoparticles were synthesized using the method reported by Peng et al. Blends of supramolecules and nanoparticles were prepared as described previously. Thin films were prepared by spin-coating the mixed solutions onto silicon wafers (200 nm thermal oxide/Si) with spinning speeds ranging from 1000 to 3000 rpm. For solvent annealing, samples were annealed using $CHCl_3$ injected inside a 250 mL Teflon chamber at room temperature. The amount of solvent injected was varied from 0.3 to 2 mL to tailor the swelling rate. The thickness of the film was monitored using Filmetrics F20 as a function of annealing time. Once the film thickness of the nanocomposite thin film reached the desired value, the chamber was opened and the $CHCl_3$ vapor was allowed to freely evaporate.

One embodiment of a method of making nanocomposites of the present invention is described as follows. The method produces a thin-film nanocomposite or, alternatively, a bulk-solid nanocomposite. In a first step, a block copolymer (BCP) and a bifunctional linking compound (PDP) are dissolved in solvents to produce a polymer solution and a bifunctional linking compound solution. In an embodiment, a single solvent is used for the polymer and bifunctional linking compound solutions. In another embodiment, different solvents are used for the polymer and bifunctional linking compound solutions. The polymer solution is added to the bifunctional linking compound solution in a second step to produce a solution that includes the BCP and the bifunctional linking compound (PDP). In an embodiment, the solution is stirred so that bifunctional linking compounds attach to a chosen block of the BCP. In a third step, nanoparticles that are dissolve in a solvent are added to the solution. The nanoparticles may comprise a metal, Au for example, a semiconductor, a magnetic material, a metal chalcogenide, a metal oxide, or some other suitable material.

In an embodiment, the solution is stirred so that the bifunctional linking compounds interact with the ligands, which are on surfaces of the nanoparticles. The solvent (or solvents) that combine the BCP, the bifunctional linking compound, and the nanoparticles are chosen on a basis of an ability to dissolve the BCP, the bifunctional linking compound, and the nanoparticles. The bifunctional linking compound may be selected so that it has favorable interactions with, but does not bond covalently to, a single block of the BCP and passivating ligands of the nanoparticles. The solution is then spin cast in a fourth step or placed in a Teflon beaker in an alternative fourth step and annealed in a fifth step or an alternative fifth step to produce the thin-film nanocomposite or the bulk-solid nanocomposite, respectively.

For bulk solid, the samples are thermally annealed under vacuum at a high enough temperature to impart polymer mobility. For thin films, the samples are solvent annealed in the presence of a high partial pressure of asolvent. These procedures result in a thin film or bulk solid with a hierarchically ordered structure and, for example, alternating conductive (or semiconductive) nanoparticle-rich and non-conductive nanoparticle-poor regions.

As described in the examples below, consider polystyrene-block poly-4-vinylpyridine (PS-b-P4VP) with molecular weights of 40,000 and 5,600, respectively, as the BCP; 3-pentadecylphenol (PDP) as the bifunctional linking compound; and spherical or pseudo-spherical Au or CdSe nanoparticles about 4 nm in diameter capped with octadecylphosphonic acid (ODPA) ligands as the nanoparticles.

The PS-b-P4VP consists of two random-coil blocks and forms spherical microdomains of P4VP surrounded by a matrix of PS. Without being bound to a particular theory, when the PDP hydrogen bonds to the pyridine rings, the P4VP block is stretched out to form a rigid comb-block. This structure occupies significantly more volume, and so the supramolecule forms lamellar, rather than spherical, microdomains. By binding to the pyridine rings, the PDP forms a periodic lamellar structure as well, resulting in a lamellae-within-lamellae hierarchical morphology. Chloroform dissolves PS and P4VP nearly equally well, and also dissolves PDP, and so was chosen as the solvent.

A range of nanoparticles with different sizes and shapes have been studied. The examples below present results with gold (Au), cadmium selenide (CdSe, ~4 nm in diameter) and lead sulfide (PbS, ~5.4 nm in diameter) nanoparticles, among others. Similar results were found with a large variety of nanoparticles with different sizes and shapes, including $CoFe_2O_4$(6 nm), Au (4-30 nm) and CdSe (2 nm) nanoparticles and CdSe nanorods (3×20 nm and 6×17 nm). The CdSe and PbS nanoparticles were capped with octadecylphosphonic acid and oleic acid ligands, respectively. Both ligands have a long alkane tail that has favorable interactions with the PDP alkane tail, and makes it possible to suspend the nanoparticles in chloroform. The interactions with PDP force the nanoparticles to the center of the P4VP(PDP) domains where, given enough nanoparticles, they form a straight line of nanoparticles.

To produce the nanocomposite, a solution of PS-b-P4VP in chloroform was added dropwise to integer multiples of a stoichiometric amount of PDP also in chloroform and stirred overnight. The nanoparticles, also suspended in chloroform, were then added at a concentration of about 20% by weight and the solution again stirred overnight. Thin films were created by spin casting the solution and annealing in chloroform vapor for at least 24 hours, and bulk samples were created by allowing the solution to dry in a Teflon beaker and annealing the result overnight.

Transmission electron microscopy. To prepare the cross section of a nanocomposite thin film for TEM imaging, the sample was floated off from the substrate on the surface of a pool of 5 vol % hydrogen fluoride solution. An epoxy block (Araldite 502, Electron Microscopy Sciences) was used to catch the film such that the sample is on top of the epoxy block with the air/polymer interface in contact with the epoxy block. The epoxy along with the sample were cured at 60° C. for at least 4 h to ensure good contact between the epoxy and the nanocomposite thin film. Thin sections, ~50 nm in thickness, were microtomed using an RMC MT-X ultramicrotome (Boeckler Instruments) and picked up on copper TEM grids on top of water. The cross-sectional TEM images were collected using a FEI Tecnai 12 transmission electron microscope at an accelerating voltage of 120 kV.

In situ grazing incidence small angle X-ray scattering measurements. GISAXS measurements were made at beamline 8-ID-E in Advanced Photon Source in Argonne National Laboratory. X-ray wavelength of 1.687 Å was used and the scattering spectra were collected on a Pilatus 1M detector during solvent annealing at an incident angle larger than the critical angle of the Si substrate, usually around 0.25°. With $CHCl_3$ vapor in the annealing chamber, the exposure time was chosen to be shorter than 5 s to avoid serious beam damage on the film. Line averaged intensities were reported as I vs. q, where $q=(4\pi/\lambda) \sin(\theta/2)$, $\lambda$ is the wavelength of incident X-rays, and $\theta$ is the scattering angle.

Atomic force microscopy. AFM was performed on a Veeco Dimension 3100 equipped with a NanoScope Ma controller and Quadrex signal processor. The spring constant of the cantilever was 10-130 N/m with a resonant frequency in the range of 250-400 kHz. The set point for auto tune was 2.5 V. The set-point amplitude was 90% of the free vibration value.

Optical property measurements. Reflection ellipsometry experiment was conducted using a spectroscopic ellipsometer (M2000U®, J. A. Woollam) to measure the complex refractive index of the as-cast and annealed supramolecular nanocomposite thin films (See Table 1). The white light source used had a broad spectrum of wavelength ranging from 250 nm to 1000 nm. When the light source is perpendicular to the sample, the diameter of the incident light spot was around 2 mm. At incident angle 75°, the spot size increased to 6 mm in the projection direction. Biaxial model was used to retrieve the refractive index of the samples. The fitting had small mean square error (<5), which confirms the reliability of the retrieved data.

Fabrication of lithographic trench pattern. The rectangular trenches were fabricated using e-beam lithography and have average width and height around 135 nm and 50 nm, respectively.

Table 1 lists the four supramolecules SP1, SP2, SP3, and SP4 that have similar total molecular weights, the same weight fraction of comb block ($f_{comb}$) but different 4VP:PDP ratios and volume fractions of free PDP. Supplementary FIG. 5a-d show the AFM images of the thin films of SP1, SP2, SP3, and SP4, respectively. All four films were annealed together and reached $f_s$=0.31 during solvent annealing. For SP1 and SP2, the supramolecules form hexagonally-packed PS cylinders in P4VP(PDP) matrix normal to the surface after annealing (Supplementary FIG. 5a-b). SP3 and SP4 form parallel cylindrical morphology under the same annealing condition (Supplementary FIG. 5c-d). The results indicate that the free PDP may significantly affect the $\chi_{eff}$ and $\Delta E_a$ and consequently, the assembly kinetics to form parallel cylindrical morphology.

When PDP: 4VP ratio >1, the amount of PDP in PS domains depends on $f_s$. Kinetically, at high $f_s$, the free PDP driven to PS and the interface effectively mediate $\chi_{eff}$, thereby lowering $\Delta E_a$ for diffusion normal to the interface. The supramolecule can easily diffuse into other domains with little enthalpic penalty. In addition, the PDP in PS domains plasticize the polymer chains to enhance the mobility of the supramolecule. As a result, the perpendicular nanostructure can no longer sustain and the parallel morphology develops and becomes optimized as $f_s$ increases. As the PDP: 4VP ratio is varied, the chain architecture changes, which directly affects the diffusion constant of the supramolecule.

What is claimed is:

1. A method of forming a supramolecular nanocomposite thin film comprising:
   mixing a block copolymer polystyrene-b-poly-4-vinylpyridine (PS-b-P4VP) with 3-pentadecylphenol (PDP) and nanoparticles in a solution;
   spin-coating the mixed solution onto a substrate; and
   solvent annealing the thin film by injecting chloroform ($CHCl_3$) solvent, wherein the amount of solvent infected is varied from approximately 0.01 to 5 mL to control a swelling rate of the thin film.

2. The method of claim 1, wherein the chloroform ($CHCl_3$) is injected inside a Teflon chamber at room temperature.

3. The method of claim 1, wherein a thickness of the thin film is monitored as a function of an annealing time.

4. The method of claim 1,
   wherein a solvent fraction $f_s$ during solvent annealing is determined by monitoring a film thickness.

5. The method of claim 1, wherein when the nanoparticles are gold (Au).

6. The method of claim 1, wherein when the nanoparticles are a semiconductor, a magnetic material, a metal chalcogenide, or a metal oxide.

7. The method of claim 1, wherein the nanoparticles are capped by 1-dodecanethiol.

8. A method of forming a supramolecular nanocomposite thin film comprising:

mixing a block copolymer polystyrene-b-poly-4-vinylpyridine (PS-b-P4VP) with 3-pentadecylphenol (PDP) and nanoparticles in a solution;
spin-coating the mixed solution onto a substrate; and
solvent annealing the thin film by injecting chloroform (CHCl$_3$) solvent, wherein a supramolecule comprises PS(19 kDa)-b-P4VP(5.6 kDa)(PDP)$_{1.7}$.

9. The method of claim 8, wherein the supramolecule, PS(19 kDa)-b-P4VP(5.6 kDa)(PDP)$_{1.7}$ is prepared by hydrogen-bonding 3-pentadecylphenol (PDP) to the 4VP units of a block copolymer (BCP) polystyrene-b-poly-4-vinylpyridine (PS-b-P4VP) at a PDP:4VP ratio of 1.7.

10. The method of claim 1, wherein spin-coating comprises spinning speeds ranging from approximately 1000 to 3000 rpm.

11. A method of forming a supramolecular nanocomposite thin film comprising:
mixing a block copolymer polystyrene-b-poly-4-vinylpyridine (PS-b-P4VP) with 3-pentadecylphenol (PDP) and nanoparticles in a solution;
spin-coating the mixed solution onto a substrate; and
solvent annealing the thin film by injecting chloroform (CHCl$_3$) solvent, wherein a solvent fraction $f_s$ in the thin film during solvent annealing is in a range of approximately between 0.01 to 0.5.

* * * * *